US008019574B2

(12) United States Patent  
Hogan et al.

(10) Patent No.: US 8,019,574 B2  
(45) Date of Patent: Sep. 13, 2011

(54) PARAMETRIC GEOMETRY MODEL FOR A BLENDED WING BODY

(75) Inventors: Thomas Allen Hogan, Seattle, WA (US); Christopher K. Droney, Huntington Beach, CA (US); Dino Roman, Lake Forest, CA (US)

(73) Assignee: The Boeing Company, Chicago, IL (US)

( * ) Notice: Subject to any disclaimer, the term of this patent is extended or adjusted under 35 U.S.C. 154(b) by 1085 days.

(21) Appl. No.: 11/958,143

(22) Filed: Dec. 17, 2007

(65) Prior Publication Data

US 2009/0152392 A1 Jun. 18, 2009

(51) Int. Cl.
G06F 17/50 (2006.01)
(52) U.S. Cl. .......................................................... 703/1
(58) Field of Classification Search .................. 703/1, 2; 244/36

See application file for complete search history.

(56) References Cited

U.S. PATENT DOCUMENTS

2003/0192986 A1* 10/2003 Page et al. ........................ 244/36

OTHER PUBLICATIONS

Sean Wakayama et al., Subsonic Wing Planform Design Using Multidisciplinary Optimization, 1995, American Institute of Aeronautics and Astronautics, Journal of Aircraft vol. 32, No. 4 pp. 746-753.*
The Challenge and Promise of Blended-Wing-Body Optimization, Wakayama, Sean and Kroot, Ilan, AIAA-98-4736, 1998.

* cited by examiner

Primary Examiner — Paul L Rodriguez
Assistant Examiner — Luke Osborne
(74) Attorney, Agent, or Firm — Felix L. Fischer

(57) ABSTRACT

A required payload volume of a Blended Wing Body air vehicle is determined and analyzed for a list of corner points that is passed to a Loft Module as keep-out points to be enclosed by a body portion established using a faceted minimum volume. Trapezoidal wing shape and size are determined, a leading edge of the body portion and trapezoidal wing leading edge are trimmed and a trailing edge of the body portion and trapezoidal wing trailing edge are blended. A leading edge elevation is established and with leading edge radius as an input smoothly encloses the payload volume in a first set of defined aerodynamic sections. A second set of aerodynamic sections and transition sections between the body portion and the trapezoidal wing are defined. The blended wing body is then lofted based on the defined sections.

19 Claims, 14 Drawing Sheets

Local Payload Height * (L/H$_{max}$)

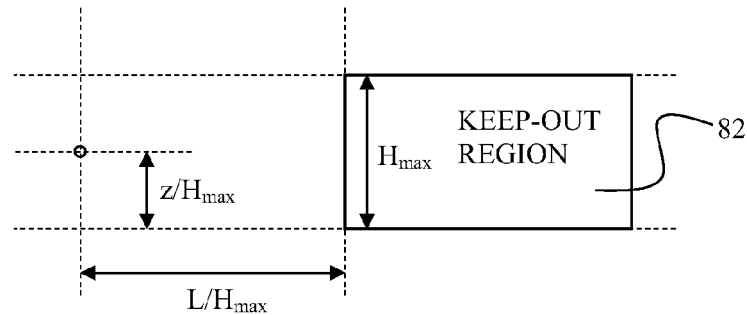
FIG. 13A
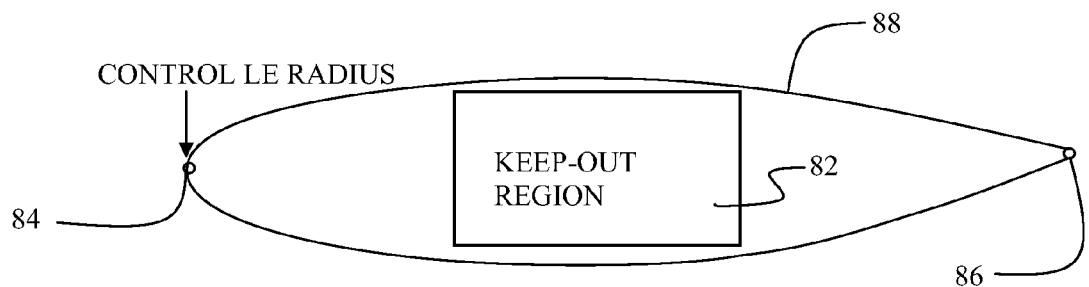
FIG. 13B
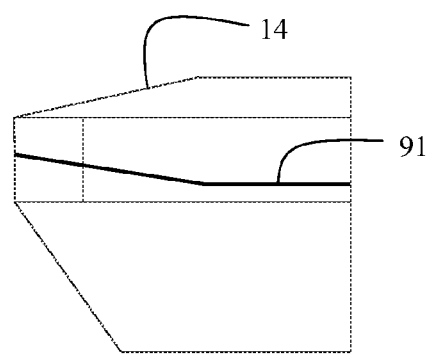 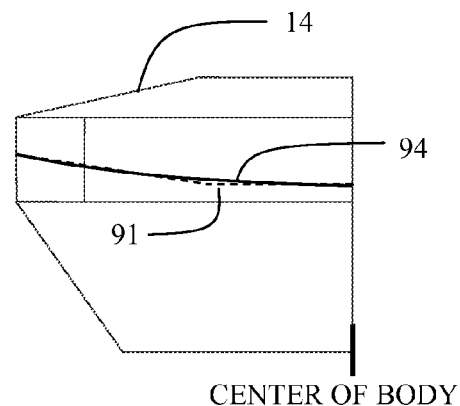
FIG. 13C   FIG. 13D

PARAMETRIC GEOMETRY MODEL FOR A BLENDED WING BODY

REFERENCE TO RELATED APPLICATIONS

The present application is copending with U.S. patent application Ser. No. 10/309,969, now issued as U.S. Pat. No. 7,333,109 on Feb. 19, 2008, entitled System, Method and Computer Program Product for Modeling at Least One Section of a Curve having common assignee with the present invention.

BACKGROUND

1. Field

Embodiments of the disclosure relate generally to the field of air vehicle design and lofting, the creation of surface shapes for varying sectional geometry, and more particularly to a method and apparatus through which an outer mold line (OML) of a Blended Wing Body (BWB) can be automatically designed around a prescribed payload so that the payload is necessarily enclosed and with input parameters like wing sweep, corner point locations, aspect ratio for use in Multidisciplinary Design Optimization.

2. Description of the Related Art

Current optimization practices for blended wing body configurations are based on low-fidelity analysis and geometry modules which simplify the vehicles geometric shape. The low fidelity of the geometry restricts the fidelity of the analysis to an equally low level. Higher fidelity analysis tools are then employed to check the accuracy of the model, refinements are made, and the optimization is re-run.

The low-fidelity geometry cannot be used for high order analysis because it passes only approximated surface information. A higher fidelity geometry tool would enable the passing of actual surfaces which can be used in higher order analysis. High-fidelity results using aero, propulsion, performance, mass properties tools are not possible when a low-level lofting tool performs its optimization and can only be applied a posteriori to geometries that are lofted based on the low-level design results. Existing solutions are therefore only adequate to provide and optimize upon low-fidelity analysis results since they do not actually generate a high-quality OML geometry.

It is therefore desirable to provide a system that achieves a higher quality in the geometry generated.

It is further desirable to provide a system where the geometry morphs smoothly as the parameters change, making it well-suited for optimization.

SUMMARY

An exemplary embodiment of the method for defining lofting parameters for a Blended Wing Body (BWB) air vehicle is accomplished by first determining the required payload volume of the air vehicle. The payload volume is then analyzed to determine a plurality of corner points of the payload volume. The coordinates of the plurality of points is passed to a loft module as keep-out points and a body portion of the blended wing body is established using a faceted minimum volume which encloses all of the provided keep-out points. A trapezoidal wing shape and size is then determined to accommodate aerodynamic performance requirements. A leading edge of the body portion and trapezoidal wing leading edge are trimmed and a trailing edge of the body portion and trapezoidal wing trailing edge are blended. A leading edge elevation is established and, with leading edge radius as an input, all other point coordinates and all tangents and remaining curvatures to smoothly enclose the payload volume in a first set of aerodynamic sections are defined. The aerodynamic requirements of the trapezoidal wing including wing thickness, camber, twist and shear establish a second set of aerodynamic sections and sections in a transition region between the body portion and the trapezoidal wing are then defined. The blended wing body is then lofted based on the first plurality of sections, second plurality of sections and transition sections.

In an exemplary embodiment, the determination of the leading edge planform is accomplished by determining local payload height based on the faceted volume. A local payload maximum height, $H_{max}$, in the chordwise direction is then established. A leading edge offset curve is determined by applying a predefined input parameter, $L\_over\_H_{max}$, to the local payload height. A first segment line and second segment line for a leading edge are determined based on input parameters defined by the leading edge first segment angle, leading edge second segment angle, and a leading edge break ratio for first and second segment. The created leading edge is then shifted to contact the leading edge offset curve.

Similarly, the creating of a trailing edge planform is accomplished by determining a trailing edge constraint from an approximate airfoil closure angle and upper and lower payload trailing edge curves from the faceted minimum volume are used to define a midpoint equidistant from each which is then offset to achieve the desired closure angle forming a trailing edge constraint curve. A trailing edge curve is constructed using input parameters of a trailing edge second segment, a trailing edge first segment angle and a trailing edge first and second segment break ratio. The trailing edge curve is then shifted to contact the trailing edge constraint curve.

In the exemplary embodiment, the trapezoidal wing shape is established by first determining an outboard wing side of body cord as a percentage of side of body chord defined as the distance between the leading edge and trailing edge curves at a lateral extent of the faceted payload volume. An outboard wing root location is then determined as a percentage of remaining chord from the leading edge of the side of body cord. An outboard wing span is established and an outboard wing leading edge sweep is defined. Determination of an outboard wing taper ratio completes the wing shape.

BRIEF DESCRIPTION OF THE DRAWINGS

The features and advantages of embodiments disclosed herein will be better understood by reference to the following detailed description when considered in connection with the accompanying drawings, wherein:

FIGS. 13A and 13B show the established relationship between the keep-out region and the wing airfoil section;

FIGS. 13C and 13D show the leading edge determination based on z over $H_{max}$ and the resulting smoothed curve as final output;

DETAILED DESCRIPTION

The embodiment disclosed herein provides a family of OML geometries generated around a pre-specified payload volume. OML geometries within the family are specified by a list of parameter values. The geometry morphs smoothly as the parameter values are changed, making it especially well-suited for optimization. The OML geometry generated is of high enough quality to feed high-fidelity analysis tools.

Figure 1:
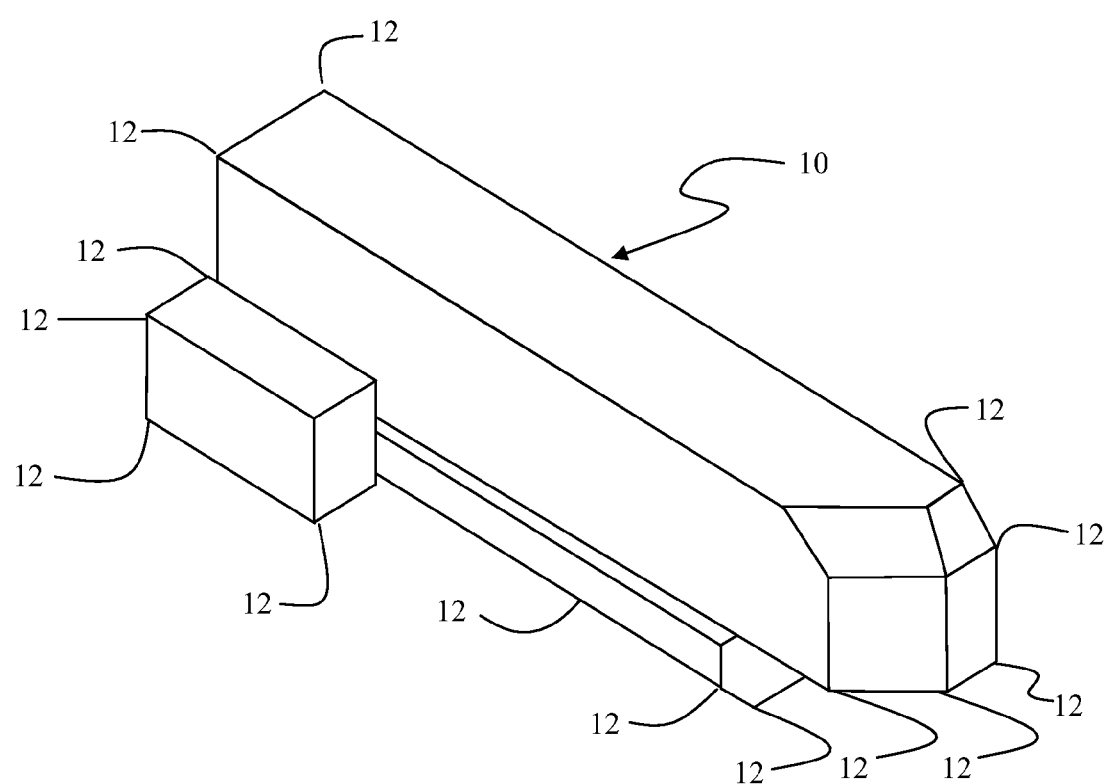
FIG. 1 is an isometric representation of the payload envelope of an air vehicle to be designed using the embodiment disclosed therein.
Figure 14A:
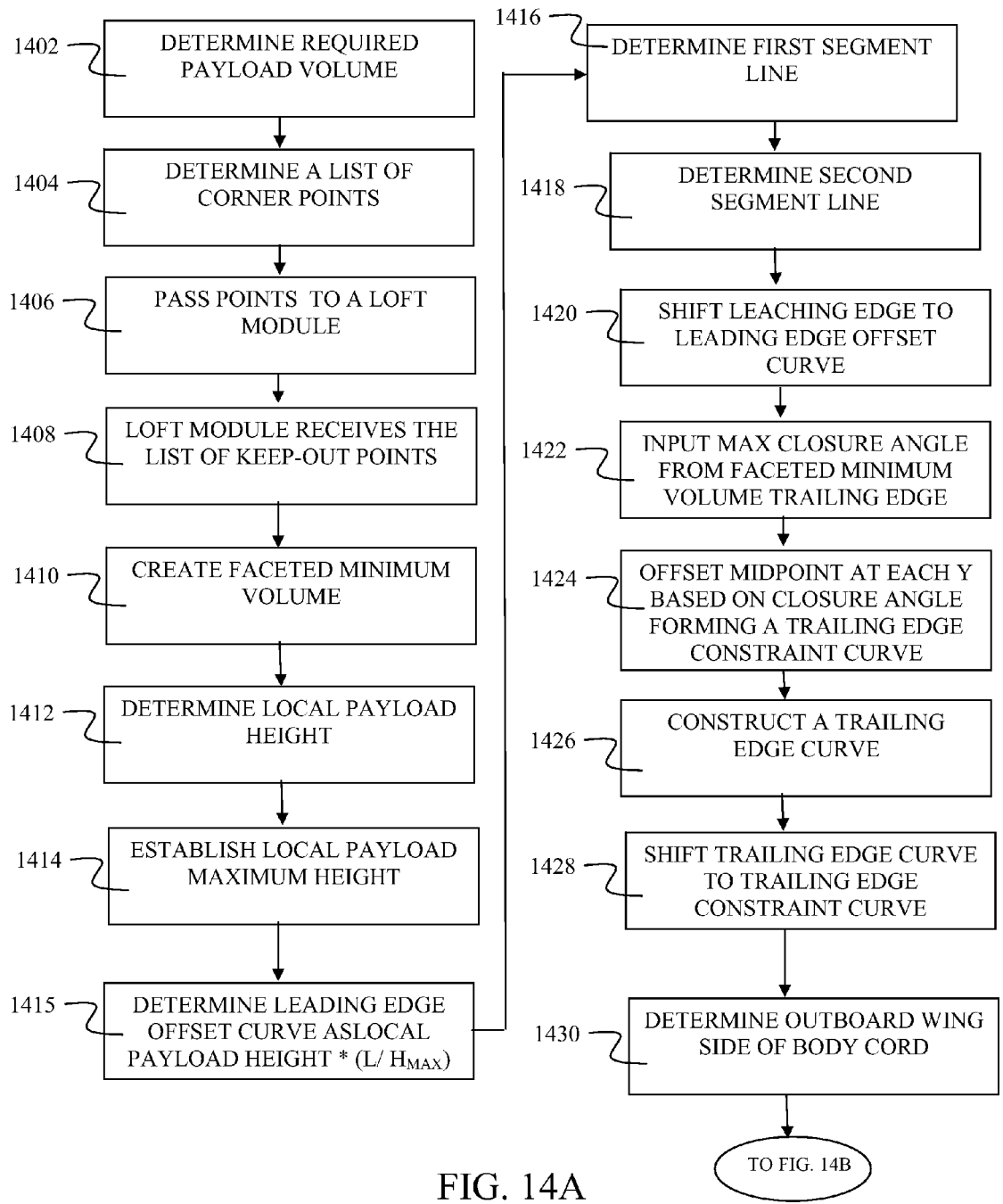
FIGS. 14A-14B are a flow chart of the system operation.
Figure 14B:
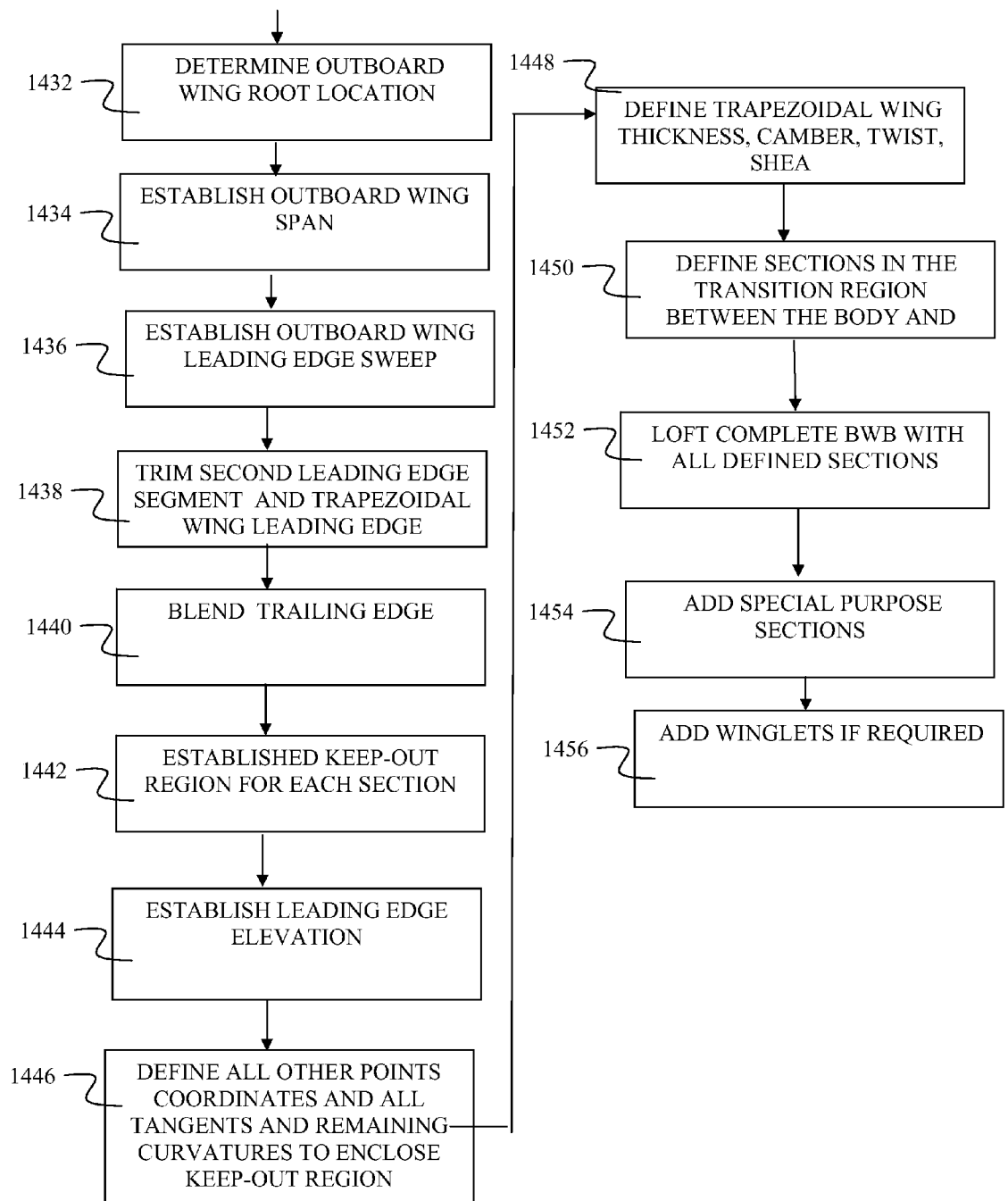

As shown in FIG. 1 with description of the operation of the system modeled in the flow chart of FIGS. 14A and 14B, the required payload volume 10 of an air vehicle is determined 1402 including, as necessary for the air vehicle mission, a cockpit geometry, main payload bay or passenger compartment, secondary payload bay (such as a baggage compartment) and other payload volume requirements. For alternative use air vehicles such as Unmanned Aerial Vehicles (UAV) cockpit geometry is eliminated or replaced with avionics, communications and control equipment. The content of the payload volume is substantially irrelevant for the modeling accomplished by the system. The payload volume is analyzed 1404 to determine a list of corner points 12 representing the corners of the various regions of the payload volume as shown in FIG. 1. This list of corner points is then passed to a Loft Module 1406 as keep-out points. The resulting benefit is that different payload modules can easily be written and integrated into the Loft Module without any major changes to the Loft Routine.

Figure 2A:
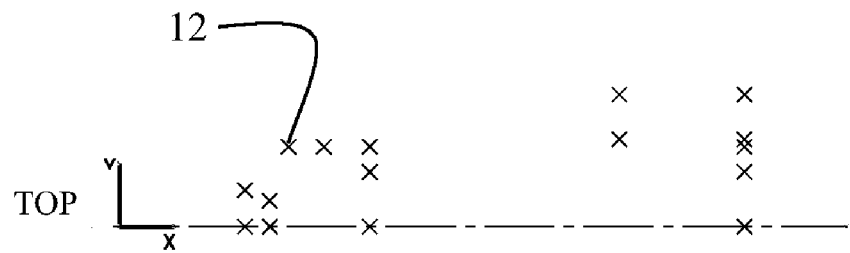
FIGS. 2A and 2B are a top and side view plotting the keep-out points established from the payload envelope of FIG. 1.
Figure 2B:
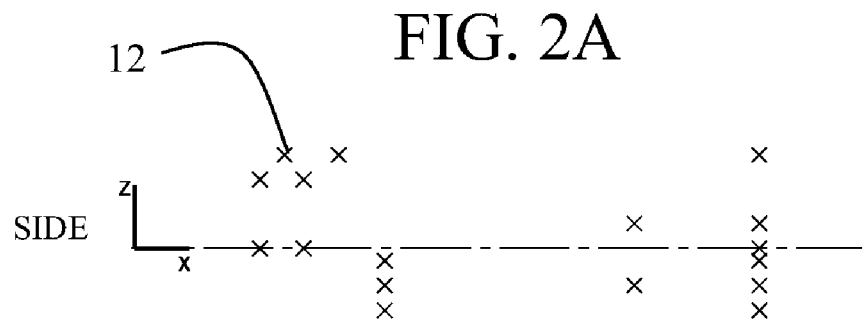

A BWB Loft Module receives the list of keep-out points from the Payload Module 1408. This will include any structural offsets that are required. The list which constitutes input parameters provides coordinates (x,y,z) for n points. Plots of the top and side views of exemplary keep-out points created from the payload volume of FIG. 1 are shown in FIGS. 2A and 2B.

Figure 3A:
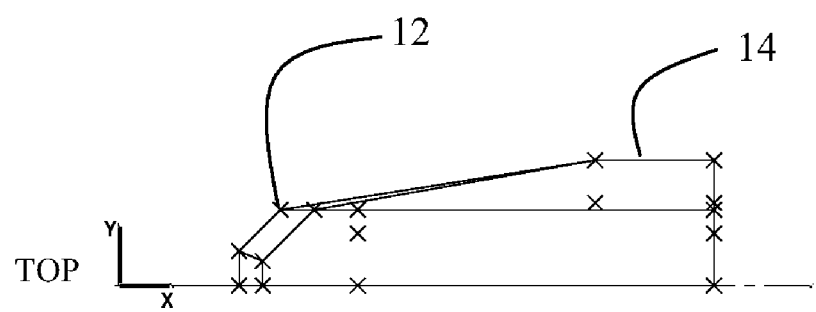
FIGS. 3A and 3B are top and side views of the faceted minimum volume created from the keep-out points of FIGS. 2A and 2B.
Figure 3B:
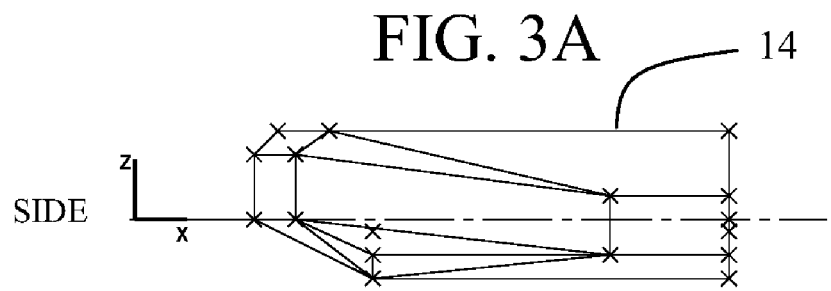

The body portion of the blended wing body is established as a first element. A minimum convex faceted volume 14, shown in top and side views in FIGS. 3A and 3B, is created 1410 which encloses all of the provided keep-out points based on the input parameters.

Figure 4A:
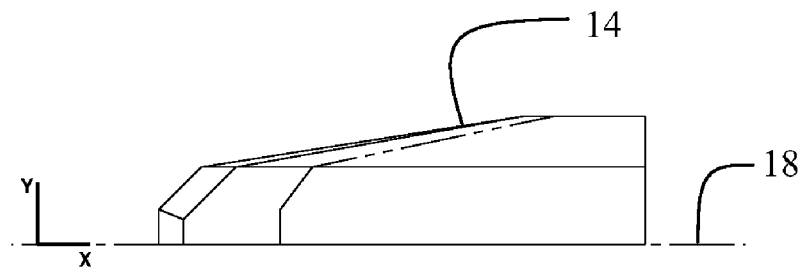
FIGS. 4A and 4B are top and side views demonstrating use of the faceted views of FIGS. 3A and 3B to establish a maximum local height required by the keep-out zone of the payload.
Figure 4B:
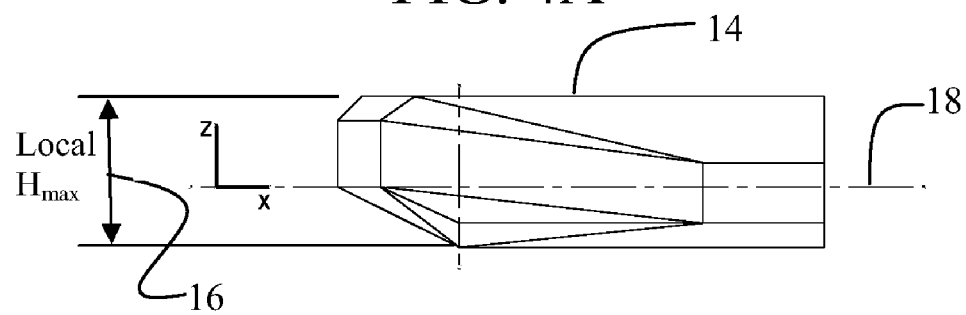
Figure 5:
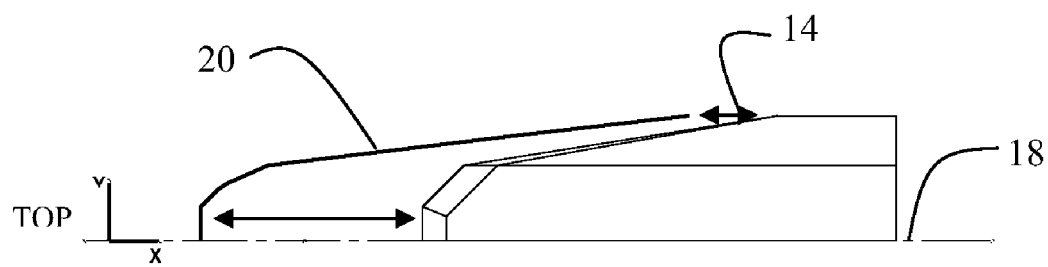
FIG. 5 is a top view showing the leading edge offset established by a parameter proportional to local payload height.
Figure 6:
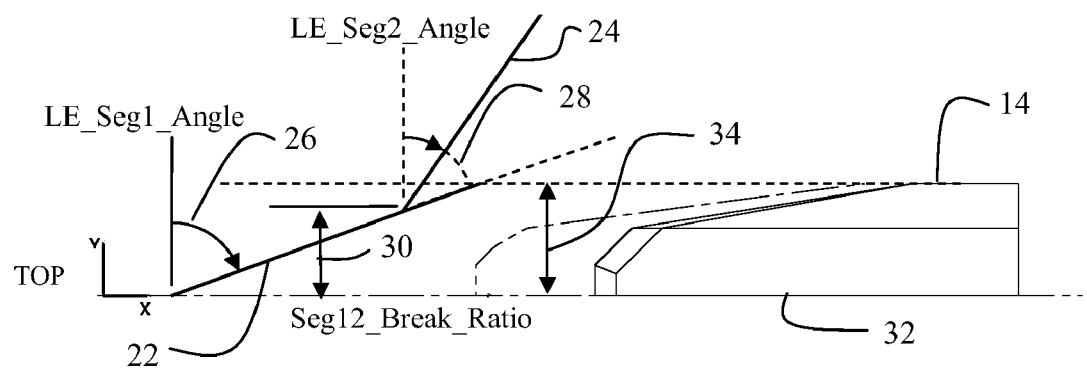
FIG. 6 is a top view demonstrating the establishment of the first two leading edge segment angles.
Figure 7:
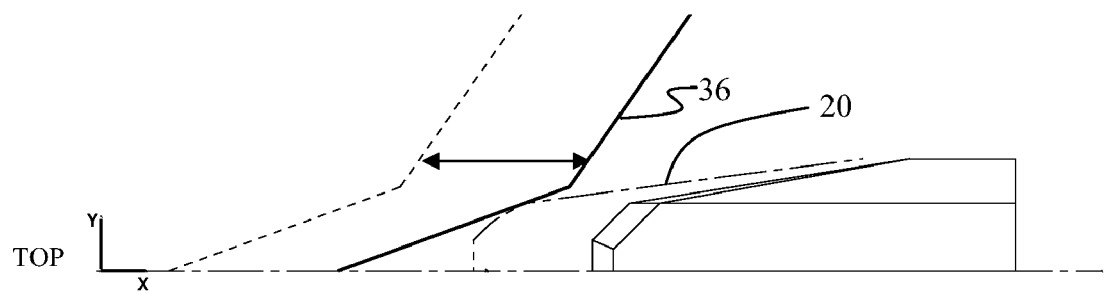
FIG. 7 is a top view demonstrating the shift of the leading edge curve established in FIG. 6 to intersect the leading edge offset established in FIG. 5.

A planform leading edge associated with the body portion is created. As used herein, the term "planform" corresponds to the shape of at least a portion of an aircraft wing or body element with the shape depicted in a relative two dimensional plane of projection. Based on the faceted volume, local payload height is determined 1412 and a local payload maximum height in the chordwise direction is established 1414. FIG. 4A shows a top view of the faceted volume sliced at the midplane along x-axis 18. FIG. 4B shows a slice of the faceted volume at some y station (i.e., as cut by some plane parallel to the xz-plane), together with the payload height, local $H_{max}$, 16 at that station. A leading edge offset curve 20, shown in FIG. 5, is determined by applying a predefined input parameter, $L\_over\_H_{max}$, to the local payload height (offset=local $H_{max}*L\_over\_H_{max}$ at each y station) 1415. As shown in FIG. 6, first segment line 22 is determined 1416 and second segment line 24 is determined 1418 for a leading edge based on input parameters defined by the leading edge first segment angle (LE_Segment1_Angle in Degrees) 26, leading edge second segment angle (LE_Segment2_Angle) 28, which specifies the leading edge second segment angle as a fraction of its first segment angle, LE_Segment1_Angle, and a leading edge break ratio for first and second segment (LE_Seg12_Break_Ratio) 30 defined as a fraction of Root 32 to Side_of_Payload 34. Root is the y value of the center of the vehicle, i.e., at y=0. LE_Seg12_Break_Ratio necessarily specifies the y station of the first corner point on the leading edge as a fraction of the y station of the side of the payload. The created leading edge 36 is then shifted to contact the leading edge offset curve 1420 as shown in FIG. 7.

Figure 8A:
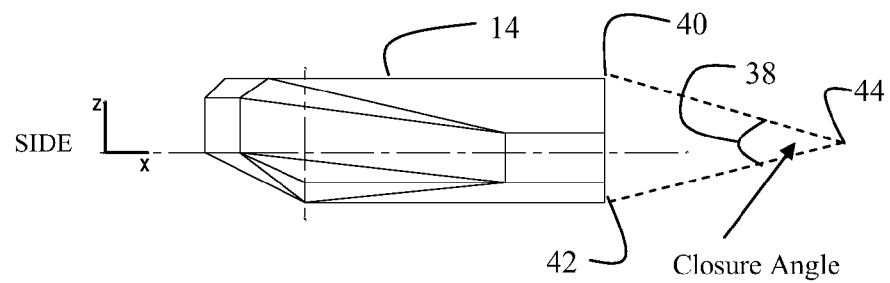
FIGS. 8A, 8B and 8C are a side, top and rear views showing the closure angle establishing the trailing edge constraint.
Figure 8B:
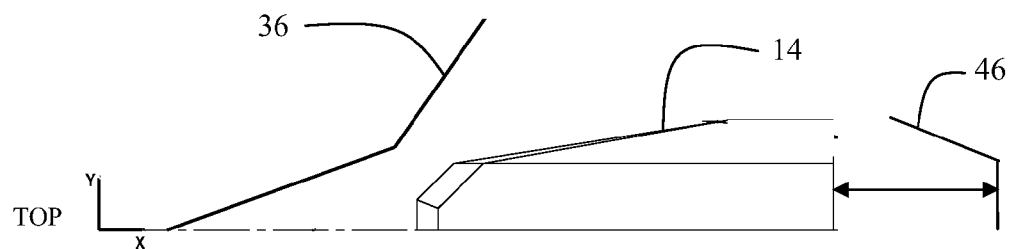
Figure 9:
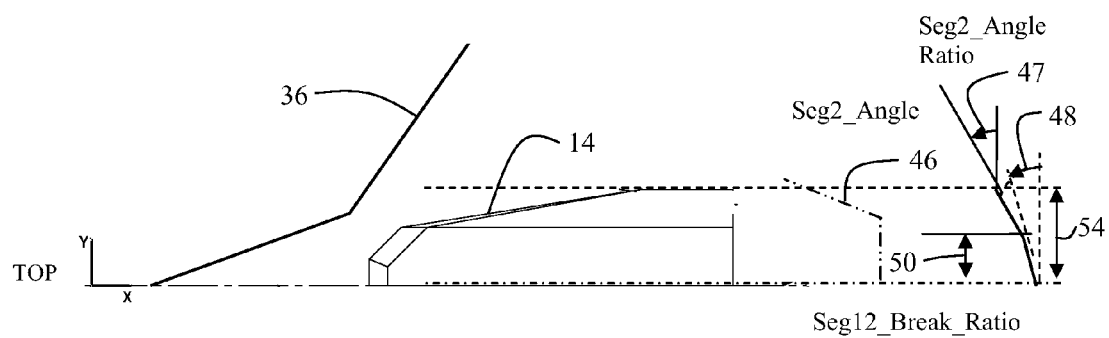
FIG. 9 shows the establishing of the first two trailing edge segment angles.
Figure 10:
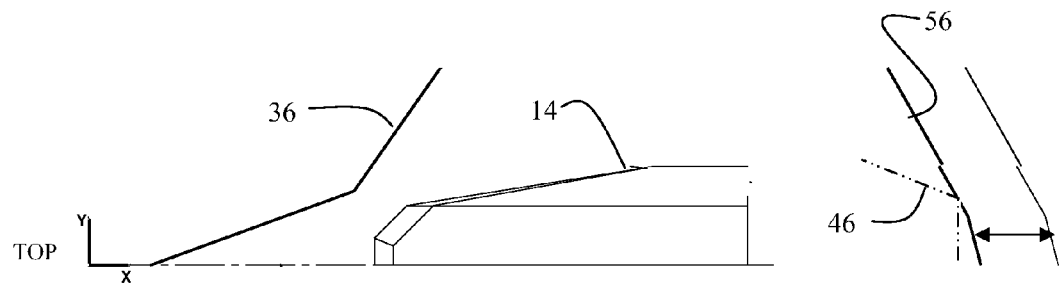
FIG. 10 shows the shift of the trailing edge curve to intersect the trailing edge constraint defined by closure angle.

A trailing edge planform is then created. A trailing edge constraint is determined from the approximate airfoil closure angle 38 (Max_Closure_Angle) allowed shown in FIG. 8A. With Max_Closure_Angle as the input parameter, a trailing edge offset point 44 is defined 1422 such that a wedge of angle Max_Closure_Angle (symmetric about the horizontal) with vertex at the offset point 44 tightly encloses the minimum convex faceted volume (i.e., necessarily touching the volume above and below, but not cutting it) as represented by points 40 and 42. Such an offset point 44 is defined at every y station 1424 in the body portion of the vehicle forming a trailing edge constraint curve 46 as shown in FIG. 8B. As shown in FIG. 9, a trailing edge curve is then constructed 1426 using input parameters created by definition of a trailing edge second segment angle (TE_Segment2_Angle) in degrees 47, a trailing edge first segment angle (TE_Segment1_Angle) 48 is defined as a fraction of TE_Segment2_Angle and a trailing edge first and second segment break ratio (TE_Seg12_Break_Ratio) defined as the ratio of Root 50 to Side of Payload 54. The trailing edge curve 56 is then shifted 1428 to contact the trailing edge constraint curve as shown in FIG. 10.

Figure 11:
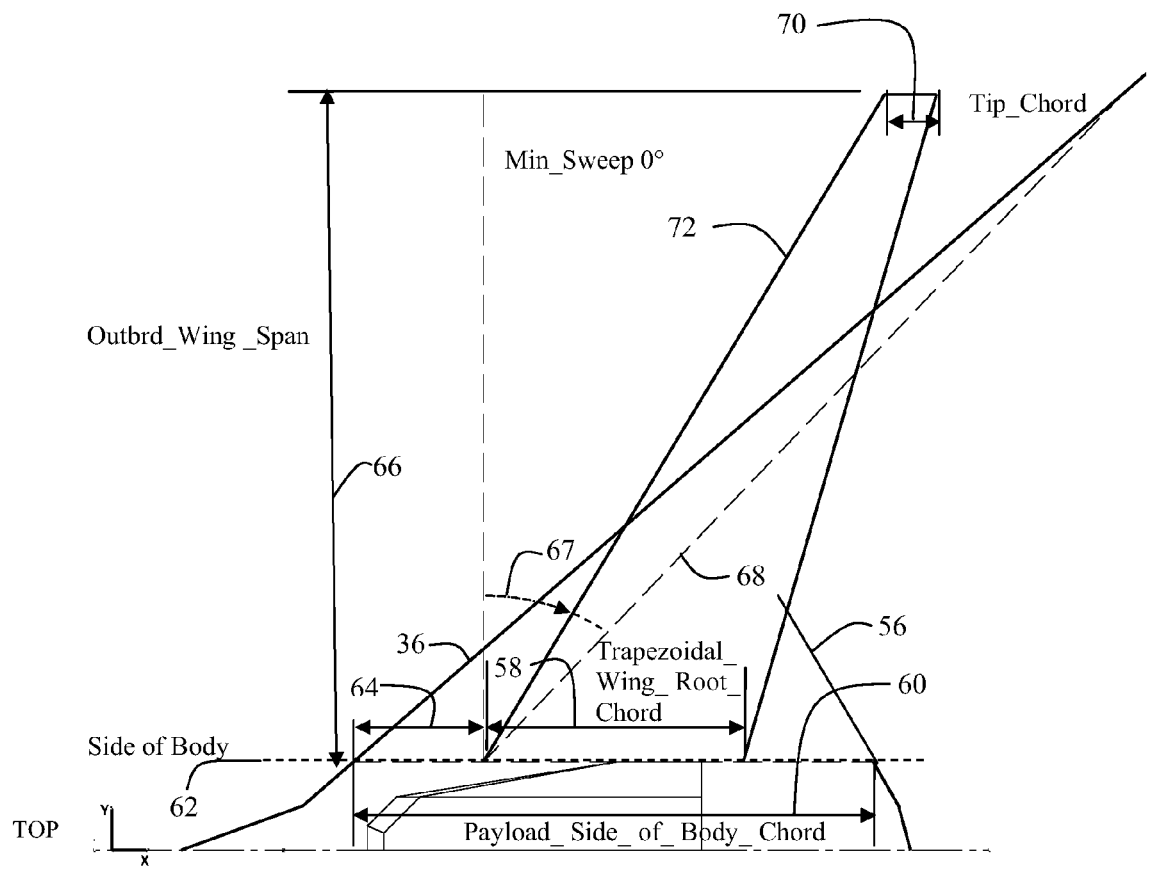
FIG. 11 shows the trapezoidal wing definition.

With the leading edge and trailing edge planform defined within the body portion of the BWB air vehicle based on the faceted payload volume, a determination of trapezoidal wing shape and size to accommodate aerodynamic performance requirements is undertaken. Input parameters for the trapezoidal wing are identified based on leading edge planform, trailing edge planform and body elements as previously defined. As shown in FIG. 11, distance between the leading edge curve and trailing edge curve at a plane parallel to the xz plane passing through the lateral extent 62 of the faceted payload volume is defined as the Payload_Side_of_Body_Chord 60. The Trapezoidal_Wing_Root_Chord 58 is defined 1430 as an input percentage of the Payload_Side_of_Body_Chord. An outboard wing root location is determined 1432 as a percentage, Outbrd_Wing_Root_Location 64, of remaining payload side of body chord from the leading edge of the trapezoidal wing side of body cord. An outboard wing span (Outbrd_Wing_Span) 66 is established 1434. An outboard wing leading edge sweep (Outbrd_Wing_LE_Sweep) 67 is established 1436 as a fraction of a Maximum_Sweep 68. Maximum_Sweep is defined as the sweep resulting from intersection of the outboard wing leading edge with the leading edge second segment at the defined outboard wing span. If maximum sweep is negative, then the maximum negative number is used. Finally, the wing's tip chord, Tip_Chord 70, is calculated as the product of the input parameter Outbrd_Wing_Taper_Ratio and the previously calculated Trapezoidal_Wing_Root_Chord.

Figure 12A:
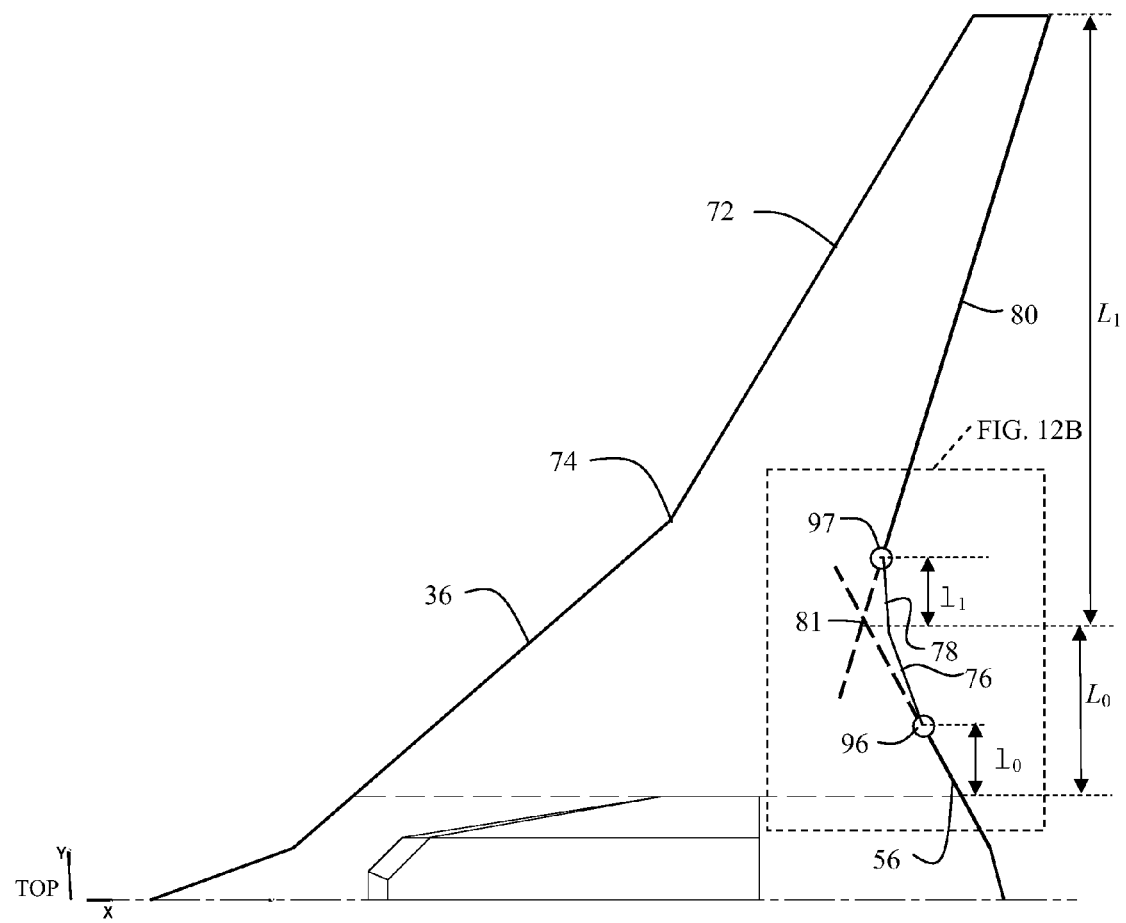
FIGS. 12A and 12B show the blending of the trailing edge segments.
Figure 12B:
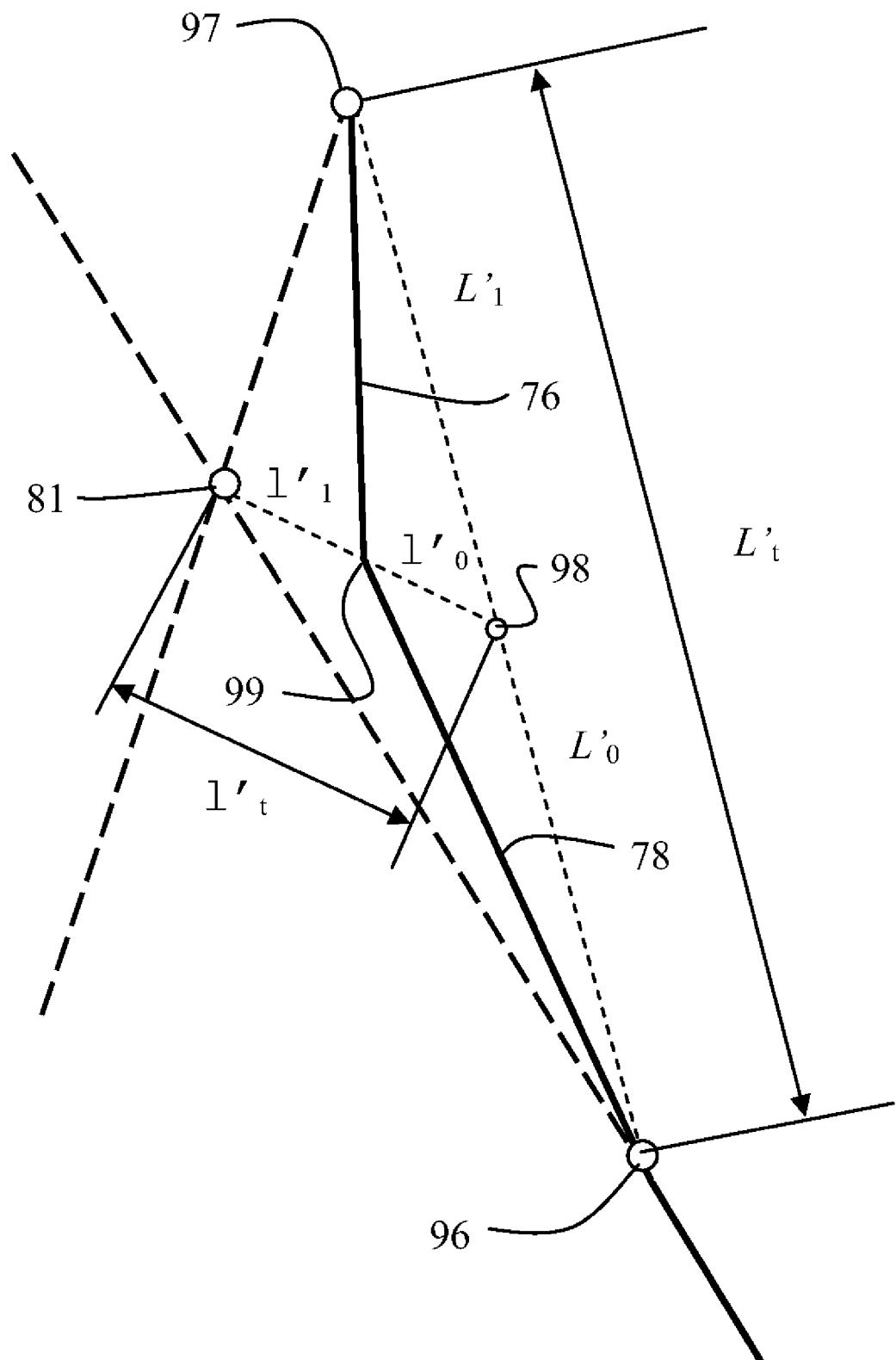

With the trapezoidal wing shape determined, second leading edge segment 36 and trapezoidal wing leading edge 72 are trimmed 1438 at intersection 74 as shown in FIGS. 12A and 12B. The trailing edge is blended 1440 with two segments 76 and 78 between the second segment of trailing edge curve 56 and trapezoidal wing trailing edge 80. Determination of length and angle for the two blending segments is based on input parameters TE_Blend_v1, TE_Blend_v2, TE_Blend_v2 and TE_v2_parm. The second trailing edge segment is trimmed a fraction of the way from the SOB to the corner 81 where it meets the trapezoidal wing trailing edge as specified by TE_Blend_v1; the trapezoidal wing trailing edge is trimmed a fraction of the way from this same corner point to its tip (outboardmost point) as specified by TE_Blend_v3; a temporary point is defined a fraction of the way from the first of these trimming points to the second as specified by TE_Blend_v2; and, finally, a middle corner point is defined a fraction of the way from this temporary point to the corner where the (untrimmed) second trailing edge segment met the (untrimmed) trapezoidal wing trailing edge. See FIG. 12A where distance to the inboard trailing edge breakpoint 96 is $l_0$=TE_Blend_v1*$L_0$ and the distance to the outboard breakpoint 97 is $l_1$=TE_Blend_v3*$L_1$ and FIG. 12B where the distance to the temporary breakpoint 98 is $L'_0$=TE_Blend_v2*($L'_t$) and the distance from the temporary breakpoint to the actual blended breakpoint 99 is $l'_0$=TE_v2_parm*($l'_t$). L't and l't are known based on geometric calculation of distances from the known breakpoints and the temporary breakpoint and corner point respectively.

In the embodiment shown, the two segments may appear equal in length and angle. Actual embodiments may employ more than two segments of differing length and angle. The number of angle ratios, and position ratios required depends on the number of blend segments assumed. In the embodiment shown and described it is two so there would be three length ratios and two angle ratios. All would be geometrically constrained to ensure design intent.

Now that the planform or top view of the vehicle has been determined, the cross sections are specified within the payload region. As shown in FIG. 13A a keep-out region 82 is established for each section 1442. Leading edge and trailing edge coordinates (x, y) 84 and 86 are defined from the planforms established above. A parameter $z\_over\_H_{max}$ is defined for establishing the leading edge elevation 1444. The elevation of the leading edge point is $z\_over\_H_{max}$ of the way from the lowest point of the keepout region to the highest point at this y station. The trailing edge elevation is established and all other points' coordinates (two coordinates per point) and all tangents and remaining curvatures are defined 1446 to smoothly enclose the keep-out region for the payload in aerodynamic shape 84 with the payload wrapped as tightly as possible as shown in FIG. 13B.

Figure 8C:
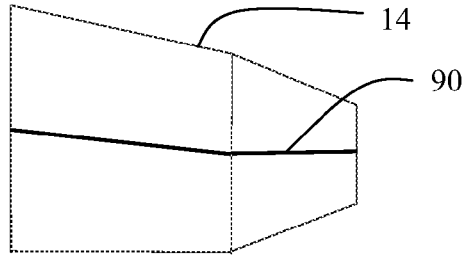
Figure 15:
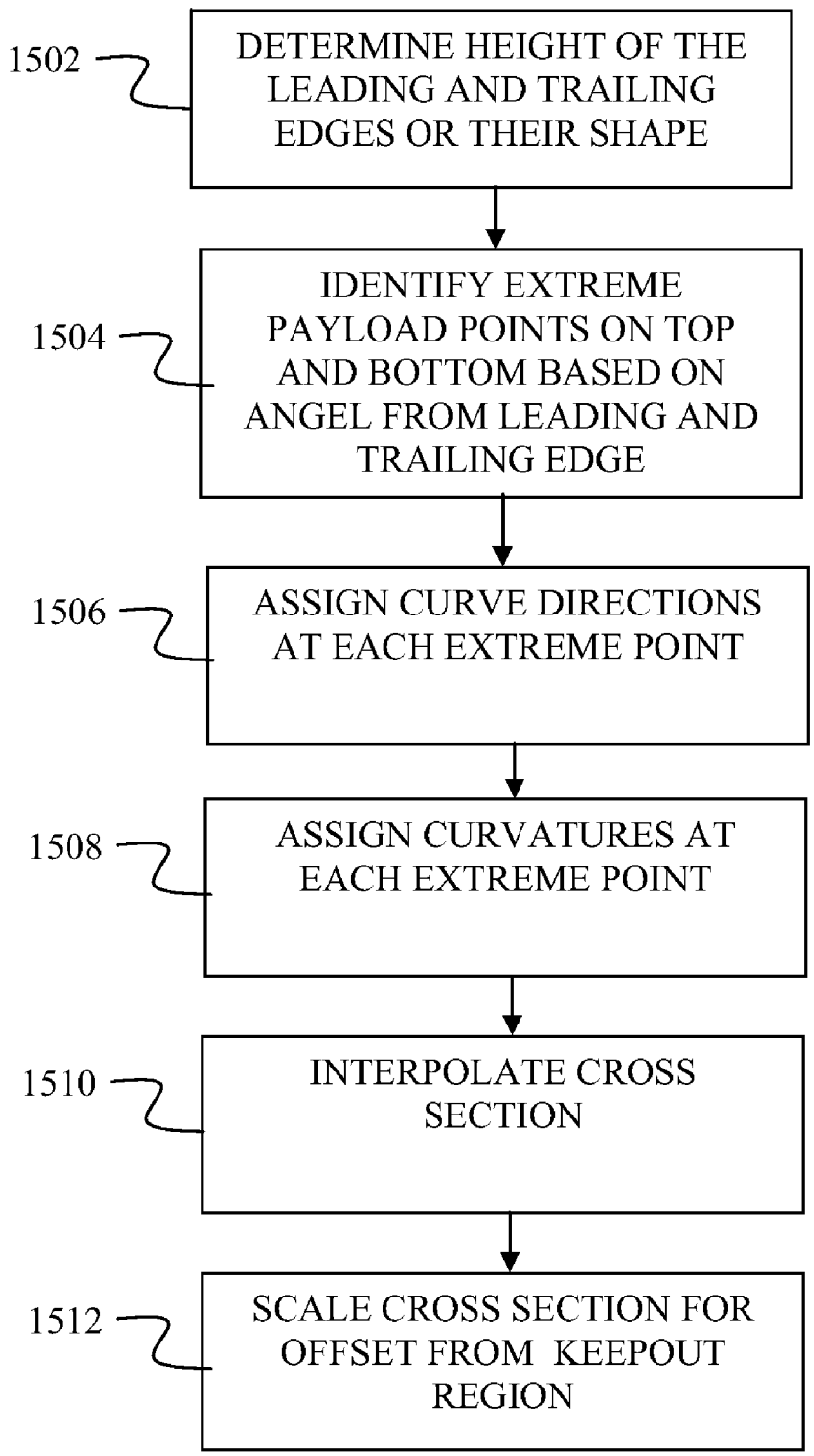
FIG. 15 is a flow chart of operating steps for creating sections around the keep-out zone; and, FIG. 16 is a side section view showing the selection and directional elements associated with the interpolation points.

As shown in the process flowchart of FIG. 15, to initiate the process of lofting around the keep-out zone, the height of the leading and trailing edges or their shape in a front or rear view are determined 1502. FIGS. 8C and 13C show rear and front views of the payload respectively. In the rear view shown in FIG. 8C, trailing edge segment 90 is at the vertex of the closure angle in FIG. 8A for each y location. In the front view in FIG. 13C, leading edge segment 91 is determined by the payload height and the parameter $z\_over\_H_{max}$ as indicated in FIG. 13A. The elevation of the leading and trailing edges approximate these curves; however, the leading and trailing edges are smoothed 1502 with a constraint to be horizontal at the center of the vehicle. Any means for approximating these curves with a smooth curve that is horizontal at the center of the body may be employed in alternative embodiments. For the embodiment shown, a least squares best fitting parabola meeting this constraint, is employed to provide final trailing edge curve 92 and leading edge curve 94 as shown in FIGS. 8D and 13D.

Figure 8D:
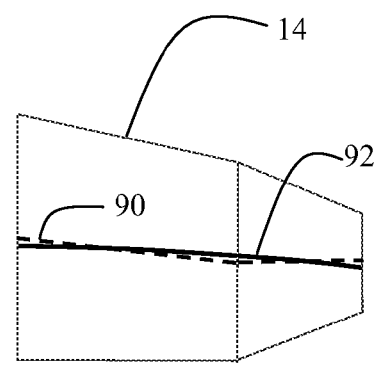
FIG. 8D is a rear view showing the trailing edge smoothed curve.

Within the payload region, the cross sections are defined at each y location in any way that will ensure that they (a) begin and end on the trailing edge prescribed in FIGS. 12A and 8D; (b) run around the top of the keep-out region, pass through the leading edge prescribed in FIGS. 12A and 13D, vertically, then run around the bottom of the keep-out region; (c) have the prescribed radius of curvature at the leading edge; (d) enclose the keep-out region; and (e) vary smoothly from the center of the vehicle out to the side of body. A particular means for obtaining this is coded in one current embodiment described in detail subsequently, but any other algorithm that meets these requirements may be employed in alternative embodiments.

Figure 16:
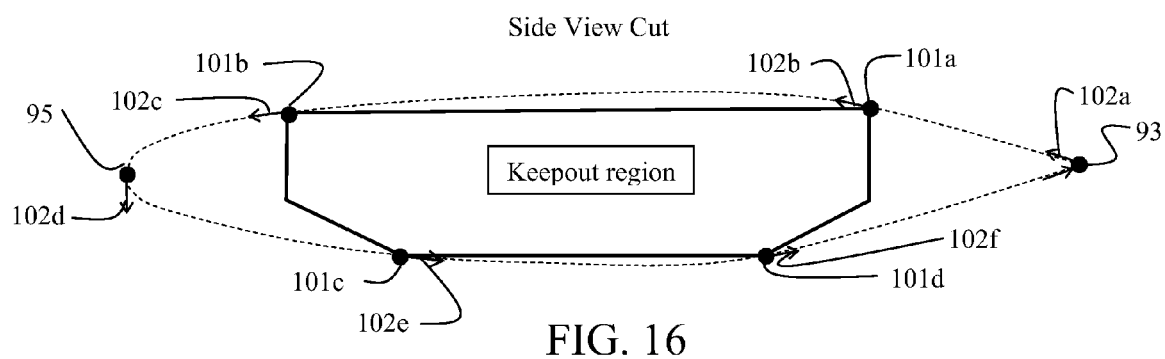

In the current embodiment the trailing edge points 93 and leading edge points 95, at each point of the trailing and leading edge curves respectively, are initiation points for the curves as shown in FIG. 16. Four additional points 101*a, b, c* and *d* are then identified 1504 on the keep-out region, two on the top and two on the bottom. These points are extreme points of the payload in the sense that the angle from a leading or trailing edge point is the maximum or minimum among all vertices of the payload region. These six points are interpolation points, i.e., all will lie on the eventual cross section. Directions represented by arrows 102*a, b, c, d*, e and f are then assigned 1506 at each point such that all points of the keep-out region and all other interpolation points lie on the same side of the line in that direction through that point. In particular, the direction at the leading edge is straight down, Curvature values are also assigned at these points 1508 (with the curvature assigned at the leading edge necessarily the reciprocal of the prescribed radius of curvature there) and an existing interpolation scheme, currently defined in co-pending U.S. patent application Ser. No. 10/309,969, issued as U.S. Pat. No. 7,333,109 on Feb. 19, 2008, entitled System, Method and Computer Program Product for Modeling at Least One Section of a Curve having a common assignee with the present invention, is used to generate a cross section 1510 that passes through these points in these directions and with these curvature values at these points. For a typical payload region, the resultant cross section will then necessarily lie completely outside the payload region. The cross sections are then scaled up by some small amount in the z direction 1512 to provide a desired offset from the keep-out region.

Returning to FIG. 12, aerodynamic requirements for the outboard wing are then refined by defining trapezoidal Wing Thickness, Camber, Twist, Shear, etc. 1448. Sections in the transition region between the body and trapezoidal wing are then defined 1450. The entire BWB is then lofted with all defined sections 1452.

Special purpose sections such as pylons, nacelles or nose requirements are then added 1454. Winglets may be grafted to the trapezoidal wing tips 1456 as dictated by aerodynamic performance requirements.

The lofted BWB air vehicle is then available to be subjected to an optimizer for revising the inputs defined. As previously noted, iteration of the selected parameters manually or through an automated optimizer employs the full utility of the system disclosed herein. As exemplary of the process, weight and balance is a fallout of the vehicle geometry. If the aircraft does not balance it would not meet the stability constraints imposed by the optimizer and thus would not be picked as an optimum vehicle.

Table 1 provides a listing of the selectable parameters employed for the method and apparatus in the embodiment as defined above including a range of values.

TABLE 1

| | | | |
|---|---|---|---|
| 0< | L_over_Hmax | <1 | (nondimensional) |
| 0< | LE_Segment1_Angle | <90 | (degrees) |
| 0< | LE_Segment2_Angle | ≦1 | (nondimensional) |
| 0< | LE_Seg12_Break_Ratio | ≦1 | (nondimensional) |
| 0< | Max_Closure_Angle | <180 | (degrees) |
| 0< | TE_Segment2_Angle | <90 | (degrees) |
| 0< | TE_Segment1_Angle | ≦1 | (nondimensional) |
| 0< | TE_Seg12_Break_Ratio | ≦1 | (nondimensional) |
| 0< | Outbrd_Wing_SOB_Chord | ≦1 | (nondimensional) |
| 0≦ | Outbrd_Wing_Root_Location | ≦1 | (nondimensional) |
| width of payload< | Outbrd_Wing_Span | | (inches) |
| 0≦ | Outbrd_Wing_LE_.Sweep | <1 | (nondimensional) |
| 0≦ | Outbrd_Wing_Taper_Ratio | ≦1 | (nondimensional) |
| 0< | TE_Blend_v1 | ≦1 | (nondimensional) |
| 0≦ | TE_Blend_v3 | <1 | (nondimensional) |
| 0< | TE_Blend_v2 | <1 | (nondimensional) |
| 0≦ | TE_v2_parm | ≦1 | (nondimensional) |
| 0≦ | X_over_Hmax | <1 | (nondimensional) | y_SOB = max{y: (x, y, z) E payload}
angle of 2nd segment of leading edge = LE_Segment2_Angle * LE_Segment1_Angle
y of 1st leading edge corner point = LE_Seg12_Break_Ratio * y_SOB
angle of 1st segment of trailing edge = TE_Segment1_Angle * TE_Segment2_Angle
y of 1st trailing edge corner point = TE_Seg12_Break_Ratio * y_SOB
Outbrd_Root_Chord = trailing edge x @ SOB − leading edge x @ SOB
Outbrd_Tip_Chord = Outbrd_Wing_Taper_Ratio * Outbrd_Root_Chord
Y_Tip = y_SOB + Outbrd_Wing_Span
maxSweep = selected
sweep = Outbrd_Wing_LE_.Sweep * maxSweep

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A method for modeling of a blended wing body (BWB) comprising:
   receiving as an input to a computer system a plurality of keep-out points representing a payload module;
   creating a faceted minimum volume that encloses all keep-out points;
   finding a local maximum height of the payload module;
   offsetting a planform leading edge by a parameter, L, determined responsive to the local maximum height to produce a L/H curve;
   defining a leading edge curve with first and second segment lines;
   shifting the leading edge curve to touch the L/H curve;
   determining trailing edge thickness/closeout angle constraint curve from approximate airfoil closure angle allowed;
   constructing a trailing edge curve;
   shifting the trailing edge curve to touch the thickness/closeout angle constraint curve;
   defining a trapezoidal wing;
   trimming the leading edge curve and blending the trailing edge curve with two piecewise linear segments;
   creating airfoil sections surrounding the payload keep-out points to create a centerbody;
   defining thickness, camber, twist and shear of the trapezoidal wing;
   defining sections in the transition region between centerbody and trapezoidal wing; and
   lofting the BWB with all the defined sections as an output of the system.

2. A method for defining lofting parameters for a lofting module in a computer system for a blended wing body air vehicle comprising the steps of:
   providing as an input the required payload volume of an air vehicle;
   analyzing the payload volume to determine coordinates for a plurality of corner points of the payload volume;
   passing the coordinates of the plurality of points to a loft module as keep-out points;
   establishing a body portion of the blended wing body using a faceted minimum volume which encloses all of the provided keep-out points;
   creating a trapezoidal wing shape and size to accommodate aerodynamic performance requirements;
   trimming a leading edge of the body portion and trapezoidal wing leading edge;
   blending a trailing edge of the body portion and trapezoidal wing trailing edge;
   establishing a leading edge elevation;
   with leading edge radius as an input, defining all other point coordinates and all tangents and remaining curvatures to smoothly enclose the payload volume in a first plurality of aerodynamic sections;

defining aerodynamic requirements of the trapezoidal wing including wing thickness, camber, twist and shear for a second set of aerodynamic sections;

defining sections in a transition region between the body portion and the trapezoidal wing; and, providing the first plurality of sections, second plurality of sections and transition sections as outputs to a lofting module.

3. The method of claim 2 in which the step of establishing a body portion comprises the steps of:

creating a leading edge planform associated with the body portion; and, creating a trailing edge planform associated with the body portion.

4. The method of claim 3 in which the step of creating a leading edge planform comprises the steps of:

determining local payload height based on the faceted volume;

establishing a local payload maximum height, $H_{max}$, in the chordwise direction;

determining a leading edge offset curve applying a predefined input parameter, $L\_over\_H_{max}$, to the local payload height determining a first segment line and second segment line for a leading edge based on input parameters defined by a leading edge first segment angle, leading edge second segment angle, and a leading edge break ratio for first and second segment; and, shifting the created leading edge to contact the leading edge offset curve.

5. The method of claim 4 in which the step of creating a trailing edge planform comprises the steps of:

determining a trailing edge constraint from an approximate airfoil closure angle and upper and lower payload trailing edge curves from the faceted minimum volume are used to define a midpoint equidistant from each which is then offset to achieve the desired closure angle forming a trailing edge constraint curve;

constructing a trailing edge curve using input parameters of a trailing edge second segment, a trailing edge first segment angle and a trailing edge first and second segment break ratio; and, shifting the trailing edge curve to contact the trailing edge constraint curve.

6. The method of claim 5 in which the step of determining a trapezoidal wing shape comprises the steps of:

determining an outboard wing side of body cord as a percentage of side of body chord established as the distance between the leading edge and trailing edge curves at a lateral extent of the faceted payload volume;

determining an outboard wing root location as a percentage of remaining chord from the leading edge of the side of body cord;

establishing an outboard wing span;

establishing an outboard wing leading edge sweep;

defining an outboard wing taper ratio.

7. The method of claim 6 wherein the step of defining the leading edge sweep comprises the step of determining leading edge sweep as a ratio proportional to Maximum Sweep.

8. The method of claim 7 wherein the step of the step of determining leading edge sweep further comprises the steps of:

defining a Maximum Sweep as the sweep resulting from intersection of the outboard wing leading edge with the leading edge second segment at the defined outboard wing span;

and, if maximum sweep is negative, then the maximum negative number is used.

9. The method defined in claim 8 wherein the step of defining all other points includes the steps of:

defining cross sections at each y location to ensure that the sections begin and end on the trailing edge;
the sections run around the top of the keep-out region;
the sections pass through the leading edge vertically;
the sections run around the bottom of the keep-out region; and, the sections vary smoothly from the center of the vehicle out to the side of body.

10. The method as defined in claim 9 wherein the step of defining cross sections comprises the steps of:

employing the leading and trailing edge points at each point of the trailing and leading edge curves respectively as initiation points for the sections;

identifying four additional points on the keep-out region as extreme points of the payload where the angle from a leading or trailing edge point is the maximum or minimum among all vertices of the payload region, such four points and each associated leading and trailing edge points are interpolation points;

assigning directions at each point such that all points of the keep-out region and all other interpolation points the on the same side of the line in that direction through that point;

further assigning that the direction at the leading edge point is straight down;

assigning curvature values at each interpolation points;

generating the complete cross section that passes through the interpolation points in the assigned directions and with the assigned curvature values.

11. The method defined in claim 10 further comprising the step of scaling up each cross section by a predetermined amount in the z direction to provide a desired offset from the keep-out region.

12. The method of claim 2 wherein the step of defining all other point coordinates comprises the steps of:

establishing a keep-out region for each section;

defining leading edge and trailing edge coordinates;

defining a parameter $z\_over\_H_{max}$ for establishing the leading edge elevation;

establishing a trailing edge radius with leading edge radius as an input; and, defining all other points coordinates and all tangents and remaining curvatures to smoothly enclose the keep-out region for the payload in an aerodynamic shape with the payload wrapped as tightly as possible.

13. The method of claim 12 wherein the step of defining the leading edge and trailing edge coordinates further comprising the steps of:

defining a trailing edge segment at the vertex of the closure angle for each y location;

determining a leading edge segment by the payload height and the parameter $z\_over\_H_{max}$;

smoothing the leading and trailing edges with a constraint to be horizontal at the center of the vehicle.

14. A method for determining a blended wing body air vehicle shape using modules in a computer system comprising the steps of:

providing as an input the required payload volume of an air vehicle;

analyzing the payload volume to determine a list of corner points of the payload volume;

passing the list of points to a Loft Module as keep-out points;

establishing a body portion of the blended wing body using a faceted minimum volume which encloses all of the provided keep-out points and creating a leading edge planform associated with the body portion by establishing a local payload maximum height, $H_{max}$, in the chordwise direction on the faceted volume, determining a leading edge offset curve applying a predefined input parameter, $L\_over\_H_{max}$, to the local payload height and determining a first segment line and second segment line for a leading edge based on input parameters defined by a leading edge first segment angle, leading edge second segment angle, and a leading edge break ratio for first and second segment, and shifting the created leading edge to contact the leading edge offset curve; and, creating a trailing edge planform associated with the body portion by determining a trailing edge constraint from an approximate airfoil closure angle and upper and lower payload trailing edge curves from the faceted minimum volume to define a midpoint equidistant from each which is then offset to achieve the desired closure angle forming a trailing edge constraint curve, constructing a trailing edge curve using input parameters of a trailing edge second segment, a trailing edge first segment angle and a trailing edge first and second segment break ratio; and shifting the trailing edge curve to contact the trailing edge constraint curve;

creating a trapezoidal wing shape and size to accommodate aerodynamic performance requirements by determining an outboard wing side of body cord as a percentage of side of body chord established as the distance between the leading edge and trailing edge curves at a lateral extent of the faceted payload volume, determining an outboard wing root location as a percentage of remaining chord from the leading edge of the side of body cord, establishing an outboard wing span, establishing an outboard wing leading edge sweep by defining a Maximum Sweep as the sweep resulting from intersection of the outboard wing leading edge with the leading edge second segment at the defined outboard wing span and, if maximum sweep is negative, then the maximum negative number is used, and defining an outboard wing taper ratio;

trimming a leading edge of the body portion and trapezoidal wing leading edge;

blending a trailing edge of the body portion and trapezoidal wing trailing edge;

establishing a leading edge elevation;

with leading edge radius as an input defining all other point coordinates and all tangents and remaining curvatures to smoothly enclose the payload volume in a first plurality of aerodynamic sections;

defining aerodynamic requirements of the trapezoidal wing including Wing Thickness, Camber, Twist and Shear for a second set of aerodynamic sections;

defining sections in a transition region between the body portion and the trapezoidal wing; and, lofting the blended wing body based on the first plurality of sections, second plurality of sections and transition sections.

15. The method as defined in claim 14 wherein the step of defining all other point coordinates comprises the steps of:

establishing a keep-out region for each section;

defining leading edge and trailing edge coordinates;

defining a parameter $z\_over\_H_{max}$ for establishing the leading edge elevation;

establishing a trailing edge radius with leading edge radius as an input; and, defining all other points coordinates and all tangents and remaining curvatures to smoothly enclose the keep-out region for the payload in an aerodynamic shape with the payload wrapped as tightly as possible.

16. The method as defined in claim 15 wherein the step of defining the leading edge and trailing edge coordinates further comprising the steps of:

defining a trailing edge segment at the vertex of the closure angle for each y location;

determining a leading edge segment by the payload height and the parameter $z\_over\_H_{max}$;

smoothing the leading and trailing edges with a constraint to be horizontal at the center of the vehicle.

17. The method as defined in claim 14 wherein the step of defining all other point coordinates comprises the steps of:

employing the leading and trailing edge points at each point of the trailing and leading edge curves respectively as initiation points for each section;

identifying four additional points on the keep-out region as extreme points of the payload where the angle from a leading or trailing edge point is the maximum or minimum among all vertices of the payload region, such four points and each associated leading and trailing edge points are interpolation points;

assigning directions at each point such that all points of the keep-out region and all other interpolation points lie on the same side of the line in that direction through that point;

further assigning that the direction at the leading edge point is straight down;

assigning curvature values at each interpolation points;

generating a complete cross section that passes through the interpolation points in the assigned directions and with the assigned curvature values.

18. The method as defined in claim 14 wherein the step of blending a trailing edge portion comprises the steps of:

determining a length and angle for two blending segments by trimming a second trailing edge segment at an inboard edge breakpoint a fraction of the way from a side of body cord to a corner meeting the trapezoidal wing trailing edge;

trimming the trapezoidal wing trailing edge at an outboard edge breakpoint a fraction of the way from the corner to its tip defining a temporary point a fraction of the way from the first of these trimming points to the second; and, defining a middle corner a fraction of the way from the temporary point to the corner.

19. The method as defined in claim 18 wherein a y dimension to the inboard trailing edge breakpoint is defined by $l_0=TE\_Blend\_v1*L_0$ where $TE\_Blend\_v1$ is a non-dimensional parameter and Lo is a y dimension from the side of body chord to the corner point, and the y dimension to the outboard breakpoint is defined by $l_1 = \text{TE\_Blend\_v3} * L_1$ where TE_Blend_v3 is a second non-dimensional parameter and $L_1$ is a y dimension from the trapezoidal wing tip to the corner point; the distance from the inboard breakpoint to the temporary breakpoint is $L_0 = \text{TE\_Blend\_v2} * (L_t')$ where TE_Blend_v2 is a third non-dimensional parameter and $L_t'$ is a distance between the inboard and outboard break points and the distance from the temporary breakpoint to an actual blended breakpoint is $l_0' = \text{TE\_v2\_parm} * (l_t')$ where TE_v2_parm is a fourth non-dimensional parameter and $l_t'$ is the distance from the temporary breakpoint to the corner.

\* \* \* \* \*